(12) United States Patent
Misra et al.

(10) Patent No.: US 6,900,474 B2
(45) Date of Patent: May 31, 2005

(54) LIGHT EMITTING DEVICES WITH COMPACT ACTIVE REGIONS

(75) Inventors: Mira S. Misra, Los Gatos, CA (US); Yu-Chen Shen, Sunnyvale, CA (US); Stephen A. Stockman, Morgan Hill, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/632,720

(22) Filed: Jul. 31, 2003

(65) Prior Publication Data

US 2004/0119077 A1 Jun. 24, 2004

Related U.S. Application Data

(60) Provisional application No. 60/435,838, filed on Dec. 20, 2002.

(51) Int. Cl.$^7$ .............................................. H01L 33/00
(52) U.S. Cl. ........................................... 257/98; 257/99
(58) Field of Search ............................... 257/79, 80, 81, 257/82, 83, 84, 85, 86, 87, 88, 89, 90, 94, 98; 438/30

(56) References Cited

U.S. PATENT DOCUMENTS

| | | | | |
|---|---|---|---|---|
| 6,620,643 | B1 * | 9/2003 | Koike | 438/30 |
| 6,664,571 | B1 * | 12/2003 | Amann | 257/79 |
| 6,753,214 | B1 * | 6/2004 | Brinkmann et al. | 438/184 |
| 2002/0190260 | A1 | 12/2002 | Shen et al. | |
| 2004/0056254 | A1 * | 3/2004 | Bader et al. | 257/79 |

FOREIGN PATENT DOCUMENTS

| | | |
|---|---|---|
| EP | 0 430 041 A | 6/1991 |
| EP | 0 635 893 A | 1/1995 |
| JP | 405190901 A * | 7/1993 |

OTHER PUBLICATIONS

Mensz P.M. et al., "InxGa1–xN/Alyga1–yN violet light emitting diodes with reflective p–contacts for high single sided light extraction," Electronic Letters, IEE Stevanage, GB, vol. 33, No. 24, Nov. 20, 1997, pp. 2066–2068.

Euroepan Search Report, 3 pages.

* cited by examiner

*Primary Examiner*—Hoai Pham
*Assistant Examiner*—Dana Farahani
(74) *Attorney, Agent, or Firm*—Patent Law Group LLP; Rachel V. Leiterman

(57) ABSTRACT

A light emitting device includes a region of first conductivity type, a region of second conductivity type, an active region, and an electrode. The active region is disposed between the region of first conductivity type and the region of second conductivity type and the region of second conductivity type is disposed between the active region and the electrode. The active region has a total thickness less than or equal to about $0.25\lambda_n$ and has a portion located between about $0.6\lambda_n$ and $0.75\lambda_n$ from the electrode, where $\lambda_n$ is the wavelength of light emitted by the active region in the region of second conductivity type. In some embodiments, the active region includes a plurality of clusters, with a portion of a first cluster located between about $0.6\lambda_n$ and $0.75\lambda_n$ from the electrode and a portion of a second cluster located between about $1.2\lambda_n$ and $1.35\lambda_n$ from the electrode.

26 Claims, 8 Drawing Sheets

LIGHT EMITTING DEVICES WITH COMPACT ACTIVE REGIONS

CROSS REFERENCE TO RELATED APPLICATIONS

This application claims the benefit of U.S. Provisional Application No. 60/435,838, filed Dec. 20, 2002, and incorporated herein by this reference.

BACKGROUND

1. Field of Invention

The invention is related to light emitting devices with reflective contacts.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as II-phosphide materials. Often III-nitride devices are epitaxially grown on sapphire, silicon carbide, or III-nitride substrates and II-phosphide devices are epitaxially grown on gallium arsenide by metal organic chemical vapor deposition (MOCVD) molecular beam epitaxy (MBE) or other epitaxial techniques. Often, an n-type layer (or layers) is deposited on the substrate, then an active region is deposited on the n-type layers, then a p-type layer (or layers) is deposited on the active region. The order of the layers may be reversed such that the p-type layers are adjacent to the substrate. Needed in the art are LED structures that increase the amount of light extracted from the device.

SUMMARY

In accordance with embodiments of the invention, a light emitting device includes a region of first conductivity type, a region of second conductivity type, an active region, and an electrode. The active region is disposed between the region of first conductivity type and the region of second conductivity type and the region of second conductivity type is disposed between the active region and the electrode. The active region has a total thickness less than or equal to about $0.25\lambda_n$ and has a portion located between about $0.6\lambda_n$ and $0.75\lambda_n$ from the electrode, $\lambda_n = \lambda_{vacuum}/n$, where n is the index of refraction in the region of second conductivity type.

In some embodiments, the active region includes a plurality of clusters, with a portion of a first cluster located between about $0.6\lambda_n$ and $0.75\lambda_n$ from the electrode and a portion of a second cluster located between about $1.2\lambda_n$ and $1.35\lambda_n$ from the electrode.

DETAILED DESCRIPTION

The examples described below are directed to semiconductor light emitting devices. Embodiments of the invention may be applicable to organic light emitting devices, or any other suitable flip chip device.

Figure 1:
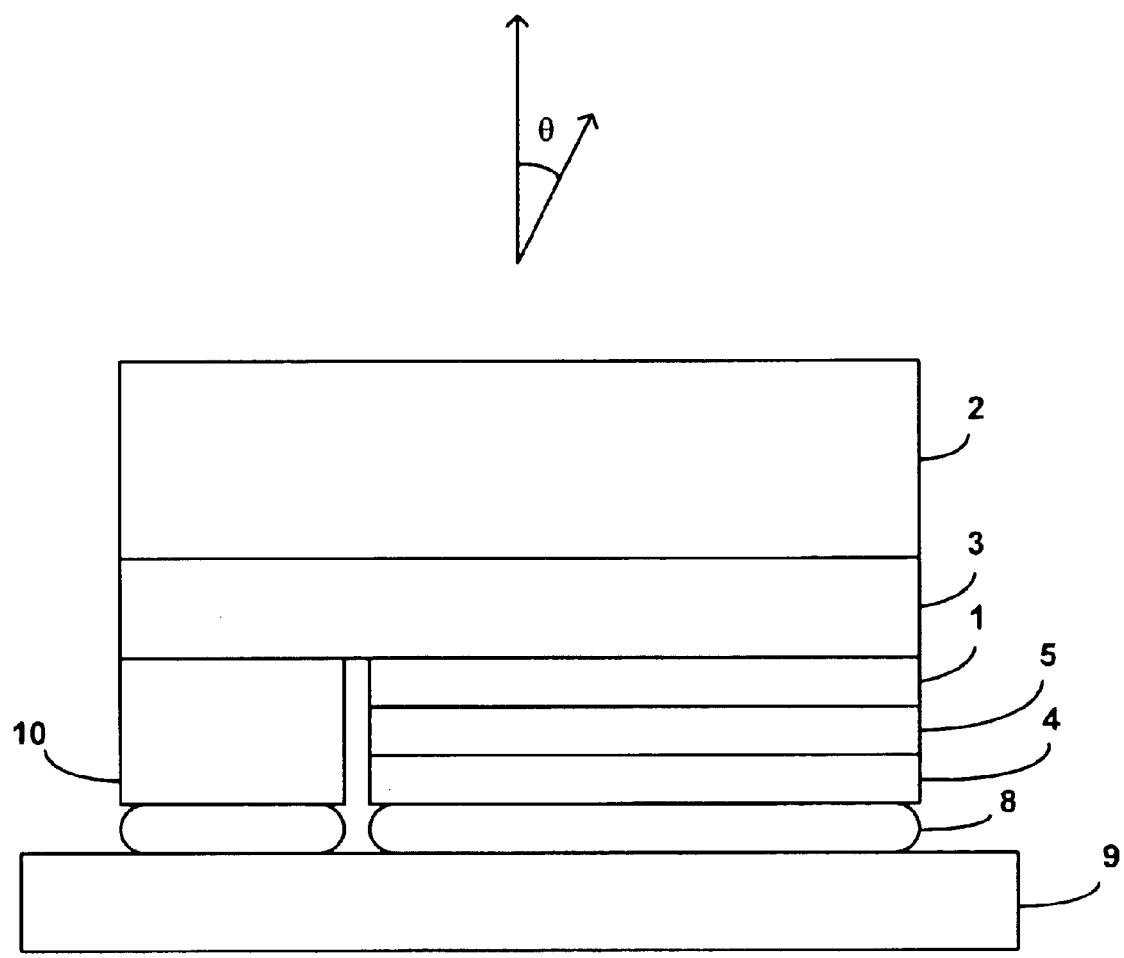
FIG. 1 illustrates a light emitting device according to embodiments of the present invention.

FIG. 1 illustrates a light emitting device according to embodiments of the present invention. A group of semiconductor layers including an n-type region 3, a light emitting active region 1, and a p-type region 5 are formed over a substrate 2. The semiconductor layers may be, for example, III-nitride layers, III-phosphide layers, II–VI layers, or any other suitable material. Each of n-type region 3, active region 1, and p-type region 5 may include multiple layers of the same or different composition, thickness, and dopant concentration. A portion of p-type region 5 and active region 1 are removed to expose a portion of n-type region 3. An n-electrode 10 is deposited on n-type region 3 and a p-electrode 4 is deposited on p-type region 5. At least one of the p- and n-electrodes are highly reflective of light emitted by active region 1. The device is physically mounted on and electrically connected to a submount 9 by interconnects 8.

Figure 8:
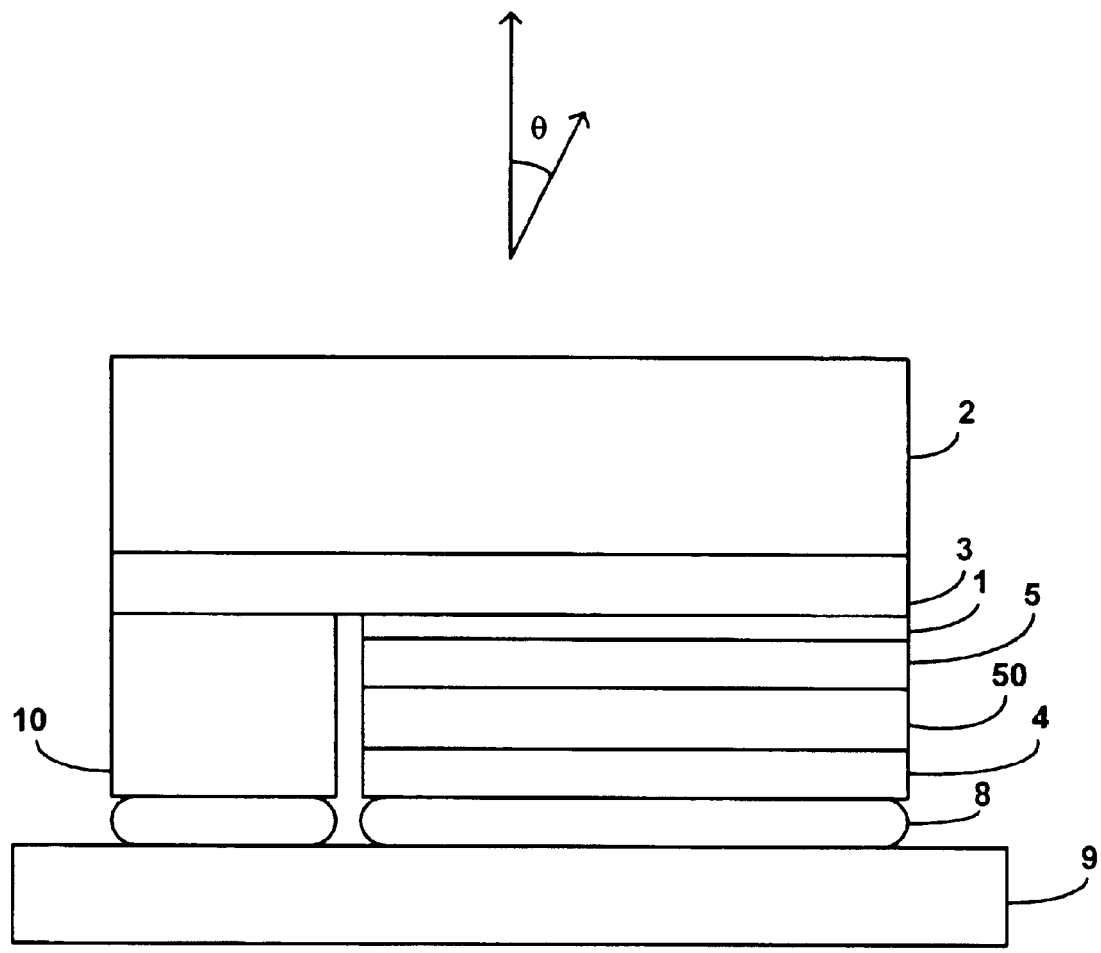
FIG. 8 illustrates an alternative embodiment of a light emitting device.

FIG. 8 illustrates an alternative embodiment of a semiconductor light emitting device. In the device of FIG. 8, p-type region 5 is separated from p-electrode 4 by a reflective surface 50 such as a distributed Bragg reflector (DBR).

Figure 10:
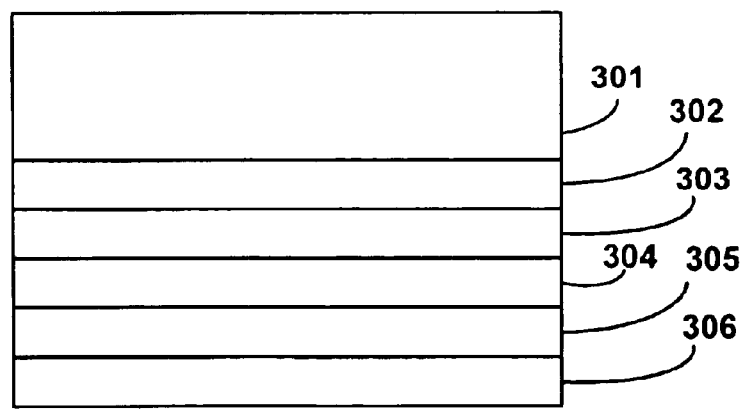
FIG. 10 illustrates a thin film electroluminescent device according to embodiments of the present invention.

FIG. 10 illustrates a thin film luminescent device such as an organic light emitting diode, according to embodiments of the present invention. A phosphor light emitting layer 304 is sandwiched between two insulators 303 and 305. Contact is made to the device through metal layer 306 and transparent electrode 302. Light is extracted through a glass superstrate 301. Organic light emitting diodes are described in more detail in Kristiaan Neyts, "Microcavities for Electroluminescent Devices," Chapter 4, Electroluminescence II, ed. Gerd Mueller, Semiconductors and Semimetals, Vol. 65.

Light extraction efficiency may be improved by controlling the placement of the light emitting layers relative to reflective layers in the device. In the device of FIG. 1, the placement of active region 1 is controlled relative to the highly reflective p-electrode 4. In the device of FIG. 8, the placement of active region 1 is controlled relative to DBR 50. In the device of FIG. 10, the placement of phosphor layer 304 is controlled relative to metal layer 306.

Returning to the device of FIG. 1, assuming the p-electrode is a perfectly conducting metal, when the center of the active region is brought within approximately an odd multiple of quarter-wavelengths of light within the material ($(2i+1)\lambda_n/4$, where $i=0, 1, 2, \ldots$) from the reflective p-electrode, constructive interference of the downward and upward traveling light results in a radiation pattern that emits power preferentially into the escape cone ($\theta\sim0°$ as shown in FIG. 1). This enhancement is in a direction close to normal to the semiconductor layers/substrate and is not susceptible to total internal reflection back into the semiconductor layers. Alternatively, slight detuning of the resonance condition, by moving the active region slightly closer to (or farther from) the p-electrode reflector, may be preferred to optimize the emission of light into the escape cone, and thus the total top surface extraction from the chip. For maximum efficiency in most applications, the distance between the active region and a perfectly conducting metal p-electrode should be approximately one quarter-wavelength.

Further retuning of the resonance condition for maximum extraction in a device with a nonideal metal contact depends on the phase shift of light reflecting off the metal. Methods for determining the phase shift of an actual reflective contact, then determining the optimal placement of an active region relative to that contact based on the phase shift are described below. Though the below description often uses the example of a III-nitride device formed on a sapphire substrate, it will be clear to a person of skill in the art that the methods described are readily applicable to other materials systems, other contact metals, and other growth substrates.

The total amount of light emitted from the LED (i.e., the total integrated flux) is the integrated flux emitted from the topside (towards the substrate) of the device added to the integrated flux emitted from the sides of the device. Side-emitted light is typically guided to the sides of the device by a waveguide created by reflective surfaces and various device layers having different indices of refraction. Waveguided light typically undergoes several reflections on its path to the side of the device, losing intensity with each reflection. In addition, light passing through the active region may be absorbed. Thus it is advantageous to extract as much light as possible from the topside of the device in the first pass, tending thereby to reduce internal losses and increase the total integrated flux.

Flipchip LEDs have a "top escape cone" near the active region such that light impinging on the topside from within the LED and lying within the escape cone exit directly from the topside of the device. For economy of language, we refer to the top escape cone merely as the "escape cone," understanding thereby that maximum topside light emission is a significant LED performance goal. The escape cone is determined by several device parameters including the indices of refraction of the various layers within the device, according to Snell's law. Light beams impinging on the topside outside the escape cone undergo total internal reflection. Such internally reflected light typically exits from the side of the device or undergoes further internal reflections and loss of intensity within the device. Thus, one approach to increasing the intensity emerging from the topside of the LED is to increase the flux impinging on the topside that lies within the escape cone.

Figure 2:
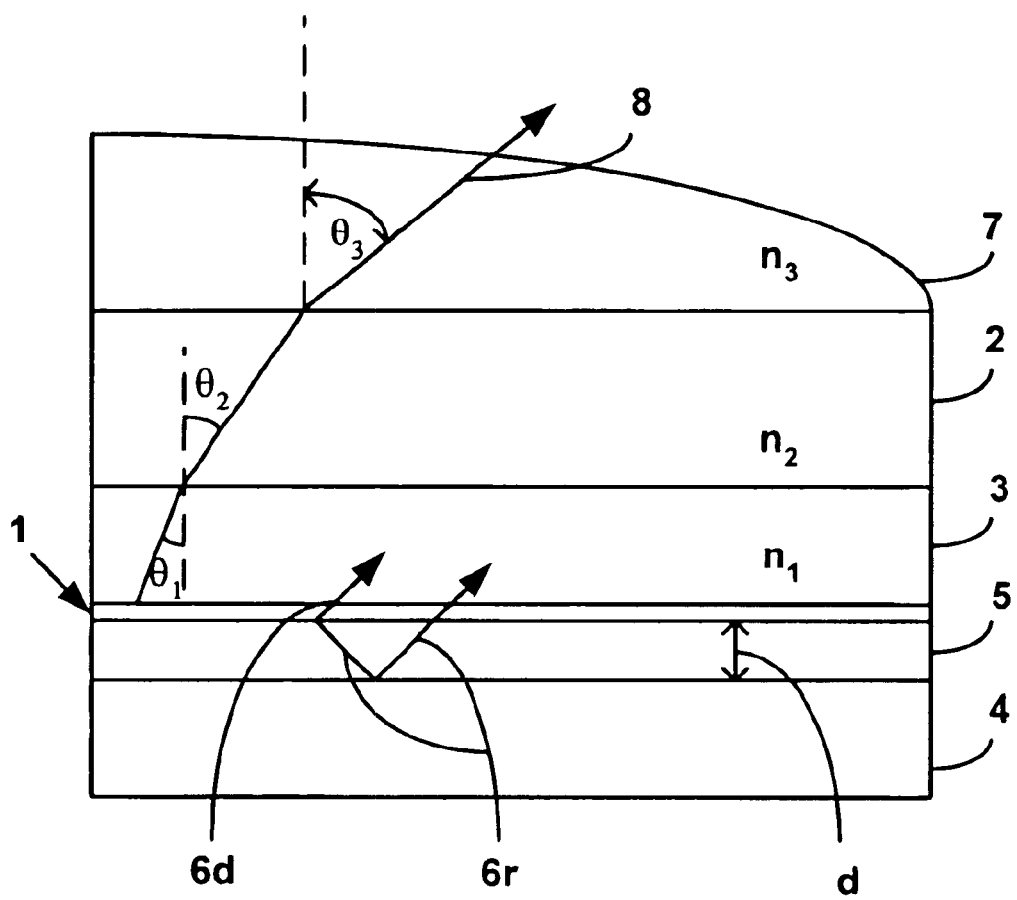
FIG. 2 illustrates a portion of the light emitting device of FIG. 1 covered with an encapsulating gel.

FIG. 2 depicts light escaping from a portion of the device illustrated in FIG. 1. The reflective positive ohmic contact 4 lies at a separation d from active region 1 and has p-type region 5 lying between the active region 1 and the contact 4.

Region 5 can comprise one layer or can comprise multiple sublayers having distinct compositions, doping characteristics and refractive indices from sublayer to sublayer or a gradation of compositions, electrical properties and optical properties throughout the thickness of p-type region 5.

To be clear in our descriptions, we consider in detail the case of a III-nitride device with $Al_xIn_yGa_zN$ layers, wherein $0\leq x\leq 1$, $0\leq y\leq 1$, $0\leq z\leq 1$, and $x+y+z=1$, including a GaN base layer 3 and a single p-type layer 5, each of base layer 3 and p-type layer 5 having a substantially uniform index of refraction throughout. Generalizations to layers having non-uniform indices of refraction (such as arising from multiple layers of different materials, gradations of optical properties, and the like) is straight-forward by the use of optical distances obtained by summing or integrating (physical thickness of layer i)/(index of refraction of layer i) over various layers of base layer material. Therefore, examples presented herein for layers having a uniform index of refraction are illustrative and not limiting.

Light generated in active region 1 and emerging from the topside of the LED passes through n-type region 3, substrate 2 and encapsulating gel 7 and undergoes refraction at each, as depicted by beam 8 in FIG. 2. GaN base layer 3 has an index of refraction $n_1=2.4$. Sapphire substrate 2 has $n_2=1.8$ and a typical encapsulating gel 7 has $n_3=1.5$. Thus, refraction away from the normal occurs as depicted in FIG. 2, causing light 8 to emerge from substrate 2 into encapsulating gel 7 with an angle from the normal of $\theta_3$.

As light travels from the site of its formation into the encapsulating gel 7 through successive regions of lower index of refraction (3, 2 and 7), the possibility of total internal reflection arises at each interface. That is, if beam 8 strikes the 3-2 or 2-7 interface from the higher index side at too glancing an angle, no light will enter encapsulating gel 7.

Applying Snell's Law to FIG. 2 gives $n_1 \sin \theta_1 = n_2 \sin \theta_2 = n_3 \sin \theta_3$. The escape cone is determined by $\theta_3=90°$, or $\sin \theta_1(\text{escape})=(n_3/n_1)$. Using the above values for the indices of refraction for GaN, sapphire and encapsulating gel yields $\theta_1(\text{escape})\approx 38.7°$. Thus, light striking the $n_1$-$n_2$ interface from the n, side will not emerge from the topside of the device if the angle of incidence exceeds $\theta_1(\text{escape})$, about $38.7°$.

Light emitted from electron-hole recombination occurring in the active region 1 can be directed into the transparent substrate directly, such as beam 6d, or following reflection from ohmic contact 4 such as beam 6r. The coherence length for light emitted in active region 1 is typically around 3 $\mu$m in GaN. Thus, if separation d is less than about 50% of the coherence length ($d\leq 1.5$ $\mu$m in GaN), strong interference between direct (6d) and reflected (6r) beams is expected to occur. The interference pattern is influenced by the distance between active region 1 and reflective contact 4.

The reflected light 6r suffers a loss in intensity and a phase shift as it bounces off reflective contact 4. To increase the light output from a flip chip and to reduce intensity loss to contact 4, contact 4 may be chosen to have high reflectivity. For example, contact 4 may have a reflectivity greater than 50%, usually has a reflectivity greater than 80%, and, in some embodiments, preferably has a reflectivity greater than 90%. The phase shift of the reflected light 6r depends on the n and k values of the metals or metal alloys used in reflective contact 4, and therefore, the phase shift will change depending on the metal type. This phase shift also influences the interference pattern. For a perfect conducting metal, the phase shift will be 180°. Generally, the contacts on real devices are not perfect conducting metals.

Once the phase shift of light reflected from reflective contact 4 is determined, the interference pattern of light escaping the device can be calculated as a function of the distance between active region 1 and reflective contact 4. As described above, the critical angle for light escaping from a GaN/sapphire/encapsulating gel interface is ~39 degrees, thus only the portion of light in GaN directed within this 39 degrees can escape through the topside of substrate 2. One way to increase light extraction from the light emitting device is to concentrate light intensity within the escape cone. Since the interference patterns emerging from the active region are controlled by the distance between active region 1 and reflective contact 4 for a given contact material, the light intensity within the escape cone may be maximized by appropriately selecting the distance between active region 1 and reflective contact 4.

The electric field of the directly emitted light 6d from a single quantum well active region is given by:

$$\vec{E}_0 = w_0 * \exp(-i\vec{k}*\vec{x}) \quad (1)$$

The electric field of the reflected light 6r from a single quantum well active region is given by:

$$\vec{E}_R = w_R * \exp(-i(\vec{k}*\vec{x} + \Phi + \Phi')) \quad (2)$$

where $w_0$ is the amplitude of emitted light 6d, $w_r$ is the amplitude of reflected light 6r, k is the direction vector, x is the position vector, $\Phi$ is the phase shift upon reflection off reflective contact 4, and $\Phi'$ is the phase shift due to the optical path length differences.

The intensity in the device, as a function of angle, $\theta$, is then given by:

$$|\vec{E}_{Total}|^2 = (\vec{E}_0 + \vec{E}_R)*(\vec{E}_0 + \vec{E}_R) = w_0^2 + w_R^2 + 2w_0 w_R \cos(\Phi + \Phi'). \quad (3)$$

The phase shift due to optical path length difference $\Phi'$ depends on the distance d between the single quantum well active region 1 and reflective contact 4, the angle $\theta$, the wavelength $\lambda$, and n (the index of refraction of the device layers, GaN in the above example) according to equation (4), where $\lambda_n = \lambda/n$:

$$\Phi' = 2\pi \frac{\Delta x}{\lambda_n} = 2\pi \frac{2d*\cos\theta}{\lambda_n}. \quad (4)$$

The phase shift due to reflection from reflective contact 4, $\Phi$, can be calculated from the n and k values of the metal in reflective contact 4 if the metal is known. See, for example, Max Born & Emil Wolf, Principles of Optics, p. 628–630 (1980), which is incorporated herein by reference. If the n and k values of reflective contact 4 are not known, the phase shift b may be determined by, for example, the following method. A detector is positioned to collect light that is emitted through the substrate normal to a device under test, in a small collection cone ($\theta$~6°). A series of devices having a varying distance between active region 1 and reflective contact 4 are fabricated including the material with unknown phase shift as reflective contact 4. If the wavelength of emitted light is constant, the extraction efficiency of the series of devices will only vary as a function of the distance d between active region 1 and reflective contact 4.

According to equation 3, the minimum in the extraction efficiency is located where $\Phi + \Phi' = m*\pi$ (m is an odd integer), where $\Phi'$ is the phase difference due to the optical path differences between directly emitting light 6d and reflected light 6r. With a series of devices each having a single quantum well placed at a different distance from reflective contact 4, the external quantum efficiency of reflective contact 4 may be measured by the detector as a function of distance between the single quantum well active region 1 and reflective contact 4. Using a second reflective contact 4 with a known phase shift, another curve of external quantum efficiency versus distance can be measured or calculated for a second set of devices with the same active-region-to-reflective-contact distances. External quantum efficiency is the product of internal quantum efficiency and extraction efficiency, $EQE = C_{ext} * IQE$, thus to eliminate the wafer to wafer differences in the internal quantum efficiency and to obtain the ratio of the extraction efficiencies, the points on the first curve can be divided by the points on the second curve, such that:

$$EQE_{unknown}/EQE_{known} = C_{ext,unknown}/C_{ext,known}. \quad (5)$$

Equation (3) may be substituted for $C_{ext,unknown}$ and $C_{ext,known}$, the measured values of external quantum efficiency for both devices may be substituted for $EQE_{unknown}$ and $EQE_{known}$, then Equation (5) may be solved for $\Phi_{unknown\,metal}$. Since d, $\theta$, $\lambda$, m, $\Phi_{known\,metal}$, and reflectivity are known, $\Phi_{unknown\,metal}$ can be calculated for any unknown reflective contact 4. Other methods may be used to determine $\Phi$. See, for example, P. Maaskant et al., *Fabrication of GaN-based Resonant Cavity LEDs*, PHYS. STAT. SOL. (submitted Feb. 19, 2002).

Figure 3:
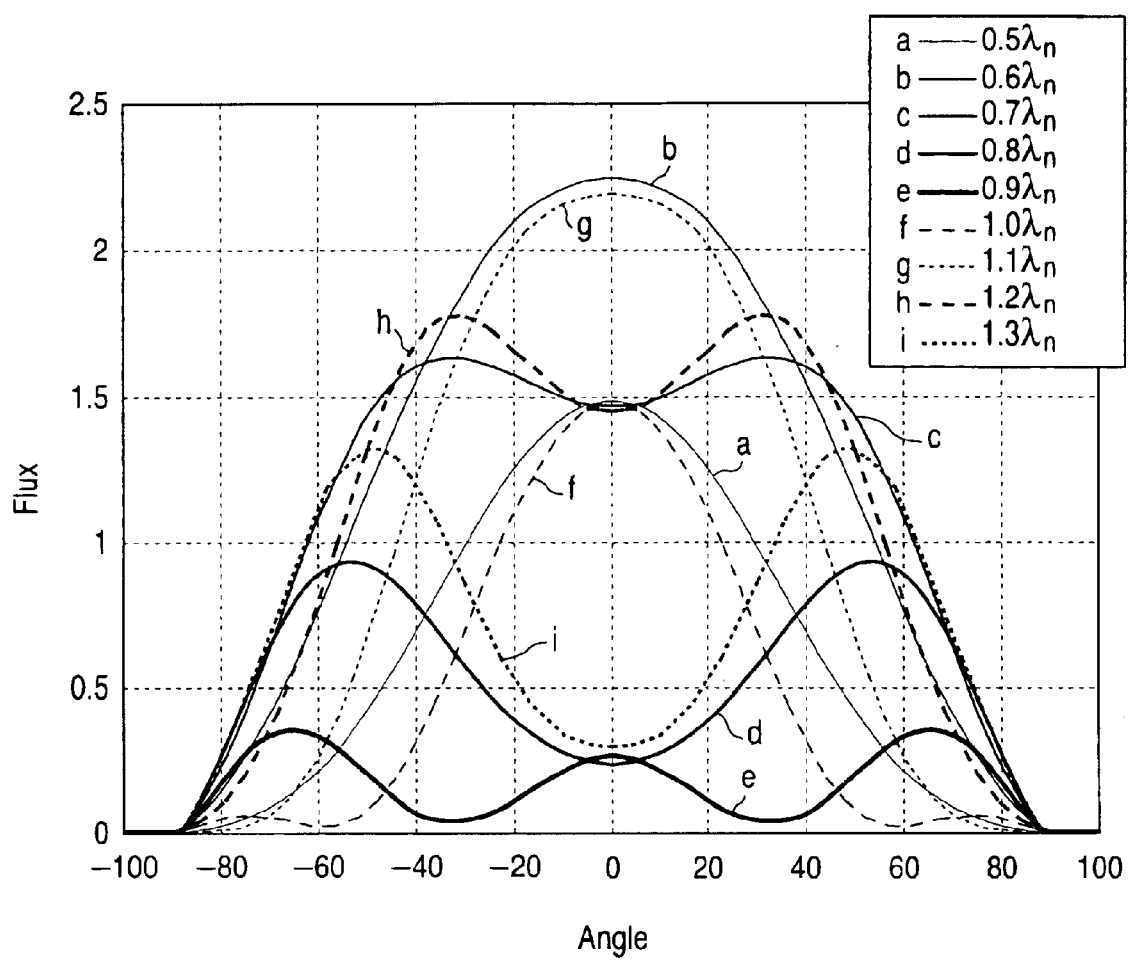
FIG. 3 illustrates the angular distribution of flux of light emitted from III-nitride single quantum well silver/nickel contact light emitting devices having different amounts of material separating the active region from the reflective contact. The devices are fabricated on sapphire substrates and are packaged with a silicone encapsulating gel. The amount of material separating the active region from the reflective contact is expressed in terms of wavelength, $\lambda_n$.

Once the phase shift due to reflection $\Phi$ is known, the intensity can be calculated as a function of distance d and angle $\theta$ using equation 3 above. FIG. 3 depicts computer-generated examples of the top-side far-field emitted light intensity (or flux) as a function of the direction of emission into silicone with respect to the normal to the LED, $\theta_3$, defined in FIG. 2. The curves in FIG. 3 are based on a single quantum well III-nitride device fabricated on a sapphire substrate with silicone as encapsulating gel 7. Various values of d are depicted, from curve a of FIG. 3 having d=0.5 $\lambda_n$ to curve i of FIG. 3 having d=1.3 $\lambda_n$, where $\lambda_n$ is the wavelength of the light in the semiconductor material separating the active region and the reflective contact. The units of flux are arbitrary as only the variations of flux with angle are of concern. The radiation patterns depend upon the distance, d, the wavelength of emitted light, and the effective indices of refraction of the materials through which the light passes in exiting from the LED, among other factors. The radiation patterns clearly change as d changes, changing the flux lying within the escape cone of 38.7°.

As illustrated in FIG. 3, a maximum in total emitted flux may occur for a radiation pattern not peaked about the central perpendicular axis of the light emitting region. That is, spacing the reflective plane from the light emitting region such that flux intensity is directed primarily normal to the surface (0 deg. in FIG. 3 or "on-axis") does not necessarily lead to maximum total emitted flux. Curve "f" in FIG. 3 provides marked on-axis peaking of emitted radiation, but at a considerable sacrifice in the total emitted flux. Thus, spacing the light emitting region from the reflector so as to maximize on-axis light emission intensity may be suboptimal for obtaining maximal LED total flux.

Figure 4:
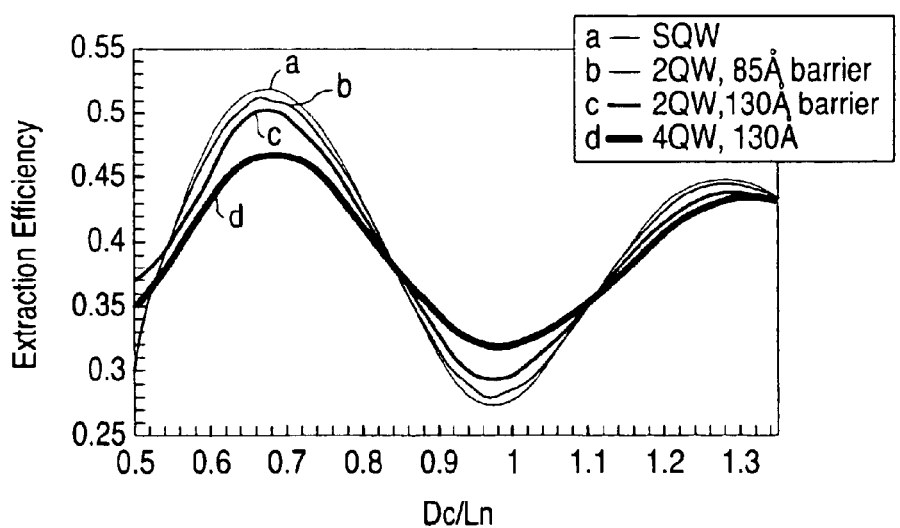
FIG. 4 illustrates extraction efficiency of top light as a function of separation between the active region and reflective contact for several devices.

The curves in FIG. 3 may be integrated and added to light emitted from the side of the device to generate curve a of FIG. 4. FIG. 4 illustrates, for four devices, computer generated plots of extraction efficiency of total flux of a 1 mm×1 mm flip chip as a function of distance between active region 1 and reflective contact 4 divided by $\lambda_n$. Curve a in FIG. 4 represents the results for a III-nitride single quantum well device with a sapphire substrate, a silicone encapsulating gel, and a reflective contact having silver/nickel contact. FIG. 4 illustrates the second and third maxima. The second maximum in extraction efficiency occurs between about $0.6\lambda_n$ and about $0.75\lambda_n$, and the third maximum in extraction efficiency occurs between about $1.2\lambda_n$ and about $1.35\lambda_n$. Thus, for maximum extraction efficiency in a III-nitride device with a (thin Ni)/Ag contact, the center of a single quantum well active region 1 should be placed between about $0.5\lambda_n$ and about $0.8\lambda_n$, or between about $1.1\mu_n$ and about $1.4\lambda_n$ from reflective contact 4.

The location of the maxima in a curve of extraction efficiency vs. distance may shift as the wavelength of the light changes. The wavelength of the light affects the phase shift due to reflection from the metal, $\Phi$. If $\Phi$ is calculated from known n and k values, the calculation takes into account the wavelength. If $\Phi$ is measured as described above, $\Phi$ must be measured for a particular wavelength to ensure proper selection of the distance between the active region and the reflective contact. The table below lists spacing ranges d between a single III-nitride quantum well and a Ni/Ag contact corresponding to the second, third, and fourth maxima in a plot of extraction efficiency vs. d for three different wavelength devices.

|  | 450 nm device | 505 nm device | 530 nm device |
|---|---|---|---|
|  | n = 2.4 | | |
|  | d/$\lambda_n$ | d/$\lambda_n$ | d/$\lambda_n$ |
| Optimal | 0.5–0.8 | 0.53–0.83 | 0.55–0.85 |
| Preferred | 0.6–0.7 | 0.63–0.73 | 0.65–0.75 |
| Optimal | 1.05–1.35 | 1.08–1.38 | 1.1–1.4 |
| Preferred | 1.15–1.25 | 1.18–1.28 | 1.2–1.3 |
| Optimal | 1.6–1.9 | 1.63–1.93 | 1.65–1.95 |
| Preferred | 1.65–1.75 | 1.68–1.78 | 1.7–1.8 |

A first maximum generally lies between about $0.1\lambda_n$ and about $0.3\lambda_n$.

Though the above example is directed to a III-nitride device with a nickel/silver contact, a silicone encapsulating gel, and a sapphire substrate, it will be apparent to a person of skill in the art that the method of choosing the spacing between the active region and reflective contact can be applied to other materials systems including but not limited to III-phosphide, III-arsenide, and II–VI, to other contact materials, to other encapsulating materials, and to other substrates. For example, a 450 nm III-nitride device with a pure silver contact has a second maximum in extraction efficiency between about $0.65\lambda_n$ and about $0.75\lambda_n$, a third maximum in extraction efficiency between about $1.15\lambda_n$ and about $1.38\lambda_n$, and a fourth maximum in extraction efficiency between about $1.73\lambda_n$ and about $1.85\lambda_n$. A 625 nm III-phosphide device (n=3.4) with a gold contact has a first maximum in extraction efficiency between about $0.1\lambda_n$ and about $0.3\lambda_n$, a second maximum in extraction efficiency between about $0.6\lambda_n$ and about $0.75\lambda_n$, a third maximum in extraction efficiency between about $1.1\lambda_n$ and about $1.25\lambda_n$, a fourth maximum in extraction efficiency between about $1.6\lambda_n$ and about $1.8\lambda_n$, and a fifth maximum in extraction efficiency between about $2.18\lambda_n$ and about $2.28\lambda_n$.

Figure 5:
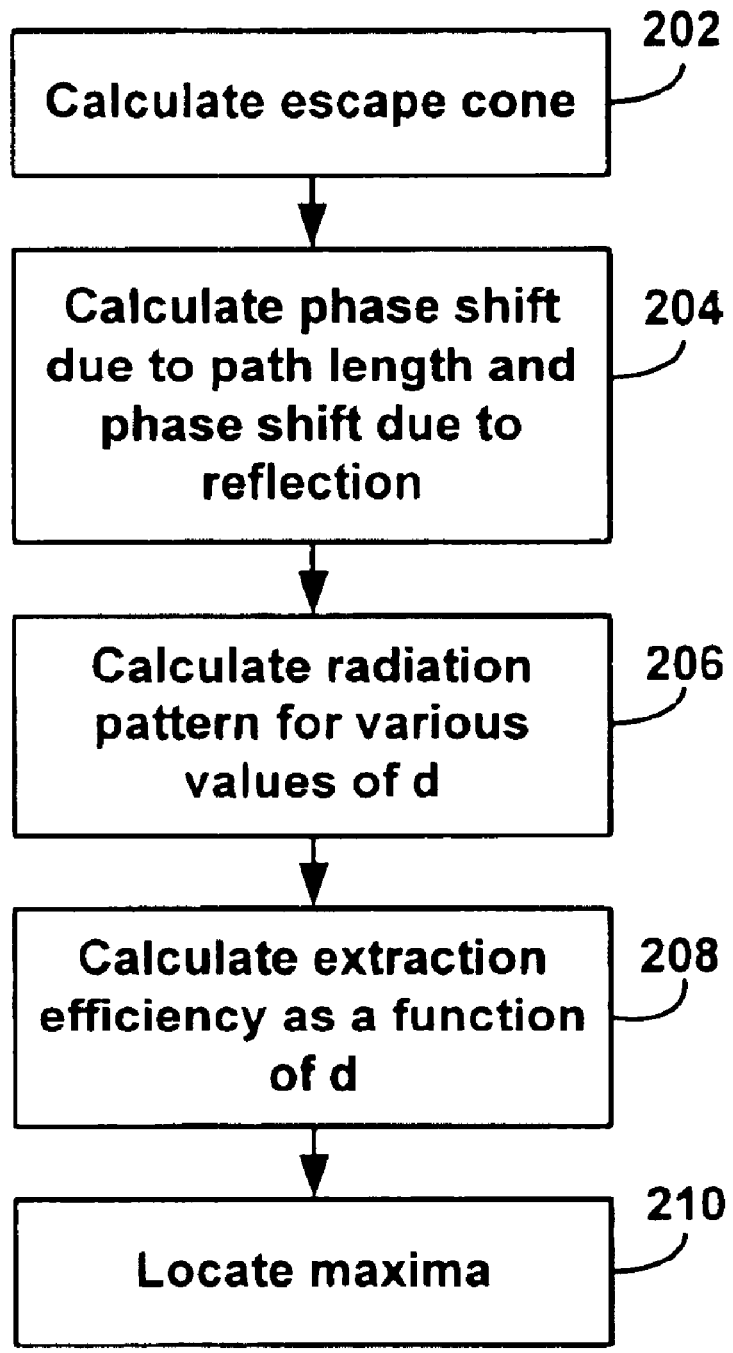
FIG. 5 illustrates a method of determining the separation between the active region and reflective contact of a light emitting device.

FIG. 5 illustrates a method for determining the spacing between the active region and reflective contact. First, in stage 202, the escape cone is calculated using the index of refraction of the semiconductor material, the substrate, and the encapsulation material or air, if no encapsulation material is used. In stage 204, the phase shift due to optical path length and phase shift due to reflection are then calculated or measured, as described above. The phase shift due to optical path length and phase shift due to reflection depend on the material used in the reflective contact and the wavelength of the light. In stage 206, the radiation pattern is calculated for various spacings between the active region and reflective contact using the phase shifts determined in stage 204, yielding a graph such as FIG. 3. The radiation pattern depends on the wavelength of light. In stage 208, the extraction efficiency is calculated as a function of the distance d between the active region and the reflective contact. The extraction efficiency depends on the radiation pattern calculated in stage 206 and the escape cone calculated in stage 202. An example of extraction efficiency as a function of d is illustrated in FIG. 4. The maxima in the plot of extraction efficiency as a function of d are identified in stage 210, which determine the spacing between the active region and the reflective contact which outputs the most light. The method illustrated in FIG. 5 is described in more detail in U.S. application Ser. No. 10/158,360, titled "Selective Placement Of Quantum Wells In Flipchip Light Emitting Diodes For Improved Light Extraction," filed May 29, 2002, and incorporated herein by reference.

The method described in FIG. 5 may be used to determine the separation between $Al_xIn_yGa_zP$, wherein $0 \le x \le 1$, $0 \le y \le 1$, $0 \le z \le 1$, and $x+y+z=1$. III-phosphide devices often have an AlInP layer adjacent to the active region, and a GaInP contact layer adjacent to the reflective contact. The reflective contact is selected for ohmic contact with GaInP. Examples of suitable reflective contact materials are Al, Ag, and Au. The reflective contact metal may be alloyed to the GaInP, which may reduce the reflectivity of the contact. To alleviate a trade-off between ohmic properties and reflective properties, a two-part contact may be used. To form a two part contact, first a layer of suitable ohmic metal is deposited and alloyed to the GaInP. Then, the metal is etched into a pattern of fine lines whereby most of the surface area of the GaInP is revealed, the fine lines serving to conduct current into the device. The exposed areas of the GaInP are then chemically etched away revealing the AlInP cladding layer beneath, thereby eliminating a large part of the adsorbing GaInP from the optical path. Finally, a suitable reflector, chosen for its optical properties without regard to the resistivity of the contact it makes to the AlInP, is deposited over both the fine lines of the first metal and the exposed AlInP. In this manner, current is conducted into the device by the first metal, and a highly reflective second metal serves as a mirror.

Figure 6A:
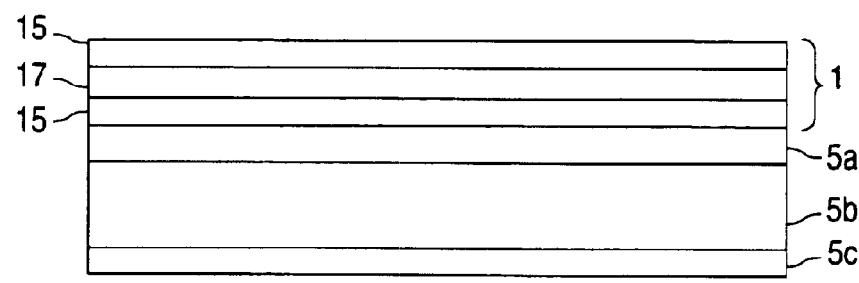
FIG. 6A illustrates one embodiment of active region 1 of FIG. 1.
Figure 6B:
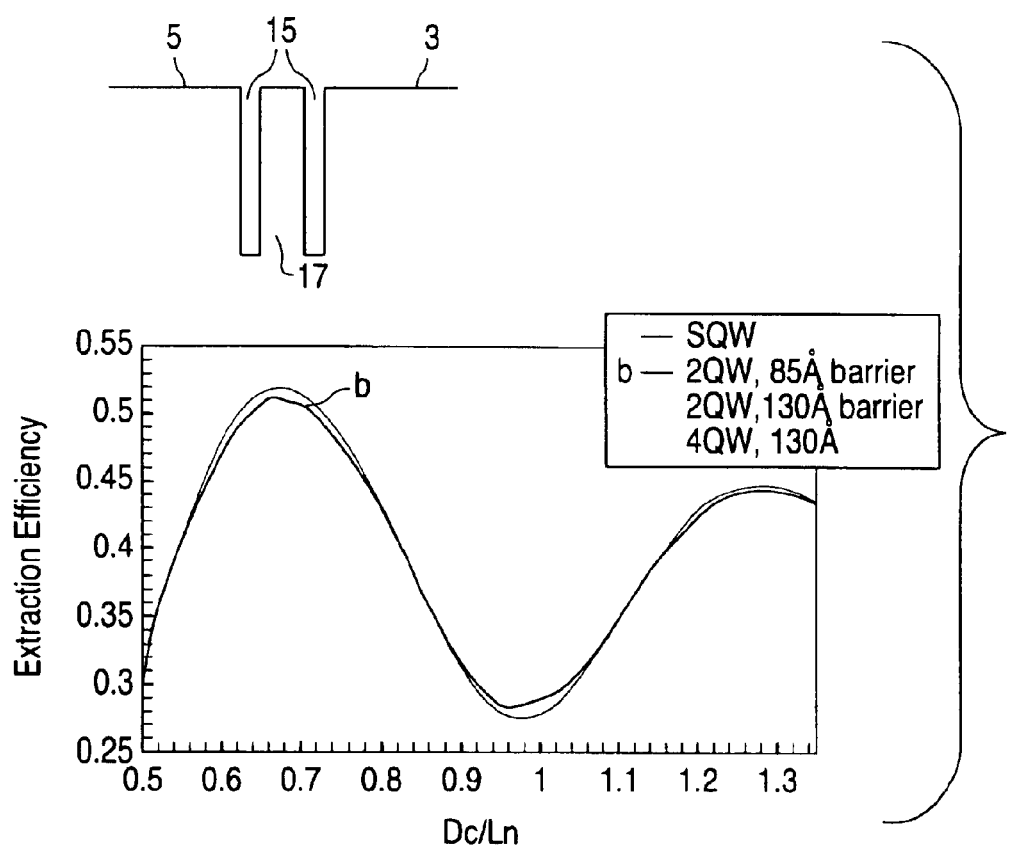
FIG. 6B illustrates the location of the device layers illustrated in FIG. 6A.

Curve a of FIG. 4A presents data for a single quantum well active region. However, the methods described herein are not limited to single quantum well devices and can also be used in connection with multiple quantum well (MQW) active regions. For example, the center of brightness and/or physical center of MQW active regions may be placed at a separation corresponding to a maximum on the appropriate plot of extraction efficiency of top-side flux as a function of distance between the active region and the reflective contact. Such an embodiment is illustrated in FIGS. 6A and 6B. The active region illustrated in FIG. 6A has two quantum well layers 15 separated by a barrier layer 17. As illustrated in FIG. 6B, the center of barrier layer 17, which is the center of active region 1, is located at the first peak of curve b of FIG. 4, the curve corresponding to a two quantum well active region. The first peak of curve b corresponds to the second maximum in a plot of extraction efficiency vs. distance between the center of the active region and the p-electrode, and is located at a distance of about 0.67 $\lambda_n$.

The extraction efficiency of a device can be improved by designing the active region and the layers between the active region and the reflective electrode such that each of the quantum wells are located as close as possible to a maximum on a plot of extraction efficiency vs. distance from the reflective electrode. FIGS. 6A, 6B, 7A, and 7B illustrate examples of devices so designed.

The device illustrated in FIGS. 6A and 6B may be, for example, a III-nitride device emitting light at a wavelength ranging from UV through green. Each of quantum wells 15 may have a thickness ranging from about 10 angstroms to about 60 angstroms, usually has a thickness between about 15 angstroms to about 40 angstroms, and preferably has a thickness of about 30 angstroms. The composition of quantum wells 15 depends on the color of light to be emitted by the device. Each of quantum wells 15 need not have the same thickness and composition. Barrier layer 17 may have a thickness ranging from about 50 angstroms to about 200 angstroms, and usually has a thickness of about 85 angstroms. A barrier layer in a shorter wavelength device may be thinner than a barrier layer in a longer wavelength device. P-type region may contain, listed in order from the active region to the p-electrode, an AlGaN confining layer 5a, a first GaN layer 5b, and a second GaN contact layer 5c. In some embodiments, confining layer 5a may have a thickness between 100 angstroms and 1000 angstroms, and usually has a thickness between about 100 angstroms to about 400 angstroms; first GaN layer 5b may have a thickness between about 100 angstroms and about 1000 angstroms, and usually has a thickness between about 400 angstroms and about 900 angstroms; and second GaN contact layer 5c may have a thickness between about 50 angstroms and about 500 angstroms, and usually has a thickness between about 50 angstroms and about 250 angstroms. The reflective p-electrode in the device illustrated in FIGS. 6A and 6B may be, for example, a multi-layer electrode with a thin layer of Ni sandwiched between GaN contact layer 5c and a thick layer of Ag.

In the embodiment illustrated in FIGS. 6A and 6B, the entire active region is located surrounding a peak on a curve of extraction efficiency vs. distance between the active region and the p-electrode. Though the active region is placed at a distance corresponding to the second maximum on the curve of extraction efficiency vs. distance in FIG. 6B, the placement of the active region may correspond to the third or a higher local maximum. Usually the active region is not placed near the first maximum, since placement of the active region at the first maximum may result in a p-type region that is too thin. Usually the fourth and higher maxima are not used as such placement may result in a p-type region that is too thick, and a decrease in extraction efficiency. The p-type region is generally fabricated at a higher temperature than the quantum wells, thus the fabrication of a thick p-type region may result in fabrication conditions that damage the quantum wells. In addition, the extraction efficiency beyond the fourth local maximum is significantly lower than for the second, third, and fourth local maxima.

Though two quantum wells are illustrated in FIG. 6A, more or fewer quantum wells may be used provided the portion of the active region furthest from the peak is reasonably close to the peak. In a device with three quantum wells separated by two barrier layers, the center of the middle quantum well is optimally located at a distance from the p-electrode corresponding to a peak on a curve of extraction efficiency vs. distance.

In the embodiment illustrated in FIGS. 6A and 6B, the total thickness of the active region is limited such that all of the active region is close to the peak on the curve of extraction efficiency vs. distance between the active region and the p-electrode. For example, the total thickness of the active region may be selected such that the active region may not be larger than $0.35\lambda_n$, and is usually not larger than $0.15\lambda_n$, and usually does not extend beyond $0.05\lambda_n$ on either side of the peak. The four curves in FIG. 4 demonstrate that as the active region becomes more compact, the total extraction efficiency improves. FIG. 4 illustrates the extraction efficiency of four devices, a single quantum well device (curve a), a two quantum well device with a thin barrier (curve b), a two quantum well device with a thick barrier (curve c), and a four quantum well device. At the first peak shown in FIG. 4, the device with the most compact active region (the single quantum well device) has the highest extraction efficiency, while the device with the thickest active region (the four quantum well device) has the lowest extraction efficiency, assuming uniform filling of carriers in the quantum wells.

In embodiments with few (e.g. 1–3) quantum wells, the center of brightness of the active region is expected to be the physical center of the active region. In active regions with quantum wells of different composition or thickness, or with more than three quantum wells, the center of brightness may not be the physical center of the active region. In such devices, the center of brightness of the active region may be located at a peak on a curve of extraction efficiency vs. distance.

Figure 7A:
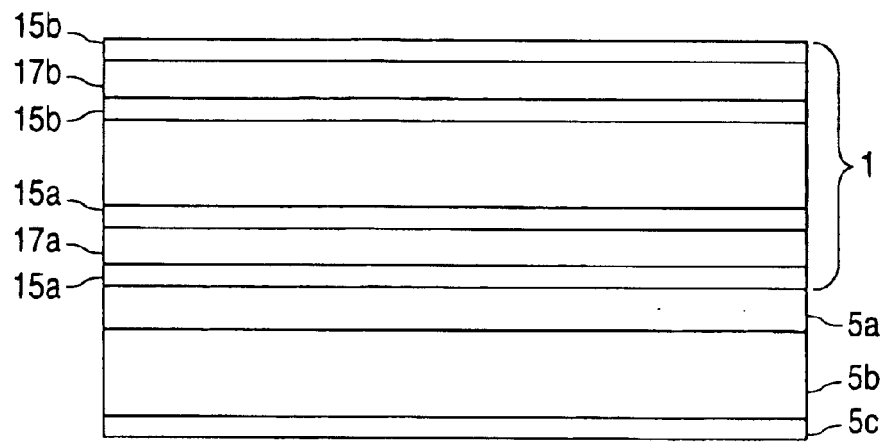
FIG. 7A illustrates an alternative embodiment of active region 1 of FIG. 1.
Figure 7B:
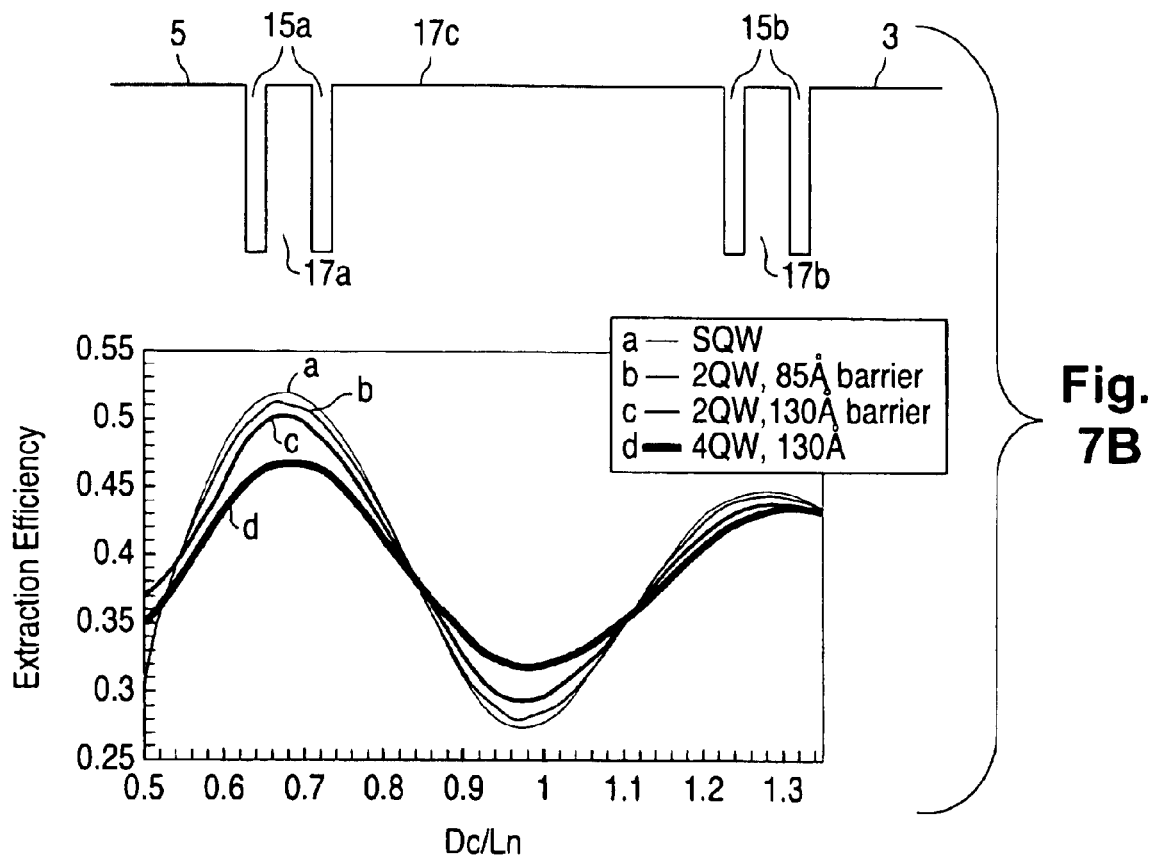
FIG. 7B illustrates the location of the device layers illustrated in FIG. 7A.

In some embodiments, the quantum wells in the active region may be clustered around peaks on a curve of extraction efficiency vs. distance, with thin barrier layers separating the quantum wells in each cluster and thick barrier layers separating the clusters. The center of brightness of each cluster may be placed at a separation corresponding to a maximum on the appropriate plot of extraction efficiency of top-side flux as a function of distance between the active region and the reflective contact. FIGS. 7A and 7B illustrate such a device. The device illustrated in FIG. 7A has two clusters of quantum wells, each with two quantum wells. The first cluster includes two quantum wells 15a separated by a barrier layer 17a, the center of which is located at the first peak shown in FIG. 4 (the second local maximum). The second cluster includes two quantum wells 15b separated by a barrier layer 17b, the center of which is located at the second peak shown in FIG. 4 (the third local maximum). The two clusters are separated by a thick barrier layer 17c. The clusters may have more or fewer than two quantum wells, and need not have the same number of quantum wells.

Figure 9:
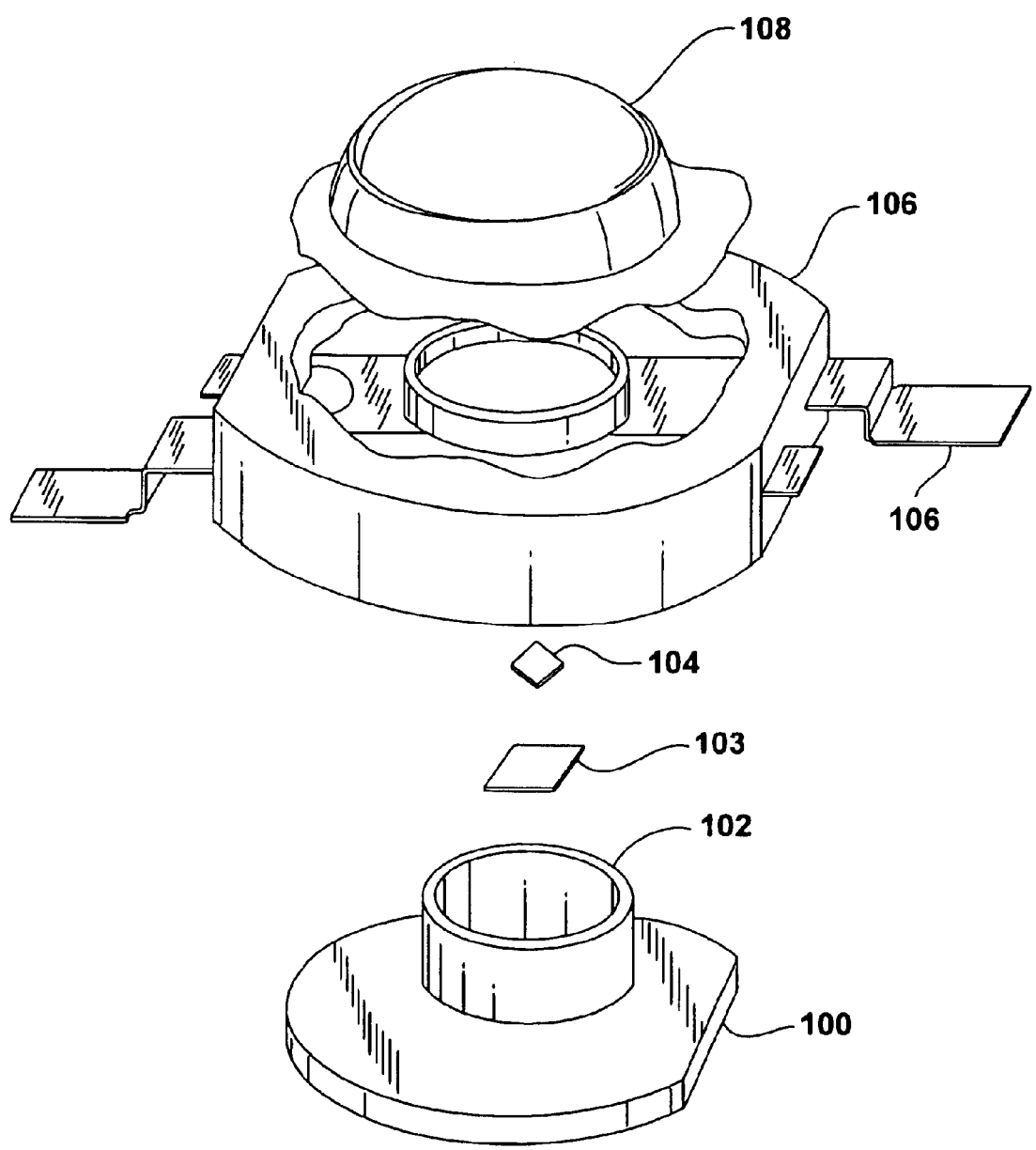
FIG. 9 is an exploded view of a packaged light emitting device.

FIG. 9 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. Alternatively, slug 100 may provide a pedestal without a reflector cup. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. For example, the invention is not limited to the contact materials and semiconductor materials described in the examples. Specifically, though many of the examples are directed to III-nitride flip chip devices with silver contacts, the invention may also be applicable to other reflective contacts and to other materials systems, such as What is being claimed is:

1. A light emitting device comprising:
 a region of first conductivity type;
 a region of second conductivity type;
 an active region disposed between the region of first conductivity type and the region of second conductivity type, the active region being capable of emitting light having a wavelength $\lambda_n$ in the region of second conductivity type; and
 a surface reflective of the light emitted by the active region, wherein one of the region of first conductivity type and the region of second conductivity type is disposed between the active region and the reflective surface;
 wherein the active region has a total thickness less than or equal to about $0.25\lambda_n$ and wherein a portion of the active region is located between $0.6\lambda_n$ and $0.75\lambda_n$ from the reflective surface.

2. The light emitting device of claim 1 wherein the active region comprises two quantum well layers separated by a barrier layer.

3. The light emitting device of claim 2 wherein each of the quantum well layers has a thickness ranging between about 10 and about 60 angstroms, and wherein the barrier layer has a thickness ranging from about 50 to about 200 angstroms.

4. The light emitting device of claim 1 wherein the active region comprises three quantum well layers separated by two barrier layers.

5. The light emitting device of claim 1 wherein the active region has a total thickness less than or equal to about $0.15\lambda_n$.

6. The light emitting device of claim 1 wherein a physical center of the active region is located at a distance from the reflective surface corresponding to within $0.05\lambda_n$ from a local maximum in extraction efficiency.

7. The light emitting device of claim 1 wherein a center of brightness of the active region is located at a distance from the reflective surface corresponding to within $0.05\lambda_n$ from a local maximum in extraction efficiency.

8. The light emitting device of claim 1 wherein the reflective surface has a reflectivity greater than 80% for light emitted by the active region.

9. The light emitting device of claim 1 wherein the active region comprises at least one III-nitride layer.

10. The light emitting device of claim 1 wherein the active region comprises at least one III-phosphide layer.

11. The light emitting device of claim 1 wherein the reflective surface comprises silver.

12. The light emitting device of claim 1 wherein the reflective surface comprises gold.

13. The light emitting device of claim 1 wherein the reflective surface comprises aluminum.

14. The light emitting device of claim 1 wherein:
 is a first electrode; and
 the first electrode is electrically connected to the region of second conductivity type, the light emitting device further comprising:
 a second electrode electrically connected to the region of first conductivity type; and
 a submount electrically connected to the first and second electrodes.

15. The light emitting device of claim 14 further comprising:
 a plurality of leads electrically connected to the submount; and
 a lens overlying the active region.

16. The light emitting device of claim 1 wherein:
 the portion of the active region located between $0.6\lambda_n$ and $0.75\lambda_n$ from the reflective surface comprises a first portion of the active region; and
 a second portion of the active region is located between $1.2\lambda_n$ and $1.35\lambda_n$ from the reflective surface.

17. The light emitting device of claim 1 wherein the reflective surface is a surface of a metal electrode.

18. The light emitting device of claim 1 wherein the reflective surface is a surface of a distributed Bragg reflector.

19. A light emitting device comprising:
 a region of first conductivity type;
 a region of second conductivity type;
 an active region disposed between the region of first conductivity type and the region of second conductivity type, the active region being capable of emitting light having a wavelength $\lambda_n$ in the region of second conductivity type; and
 an electrode reflective of the light emitted by the active region, wherein the region of second conductivity type is disposed between the active region and the electrode;
 wherein:
 the active region comprises a first cluster and a second cluster;
 a portion of the first cluster is located between $0.6\lambda_n$ and $0.75\lambda_n$ from a surface of the electrode; and
 a portion of the second cluster is located between $1.2\lambda_n$ and $1.35\lambda_n$ from a surface of the electrode.

20. The light emitting device of claim 19 wherein each of the first cluster and the second cluster comprise a plurality of quantum wells separated by at least one barrier layer.

21. The light emitting device of claim 20 wherein a thickness of each of the first cluster and the second cluster is less than or equal to about $0.35\lambda_n$.

22. The light emitting device of claim 20 wherein a thickness of each of the first cluster and the second cluster is less than or equal to about $0.15\lambda_n$.

23. The light emitting device of claim 19 wherein the first cluster and the second cluster are separated by a barrier layer.

24. The light emitting device of claim 19 wherein the active region comprises at least one III-nitride layer.

25. The light emitting device of claim 19 wherein the active region comprises at least one III-phosphide layer.

26. A light emitting device comprising:
 a region of first conductivity type;
 a region of second conductivity type;
 an active region disposed between the region of first conductivity type and the region of second conductivity type, the active region being capable of emitting light having a wavelength $\lambda_n$ in the region of second conductivity type; and
 an electrode reflective of the light emitted by the active region, wherein the region of second conductivity type is disposed between the active region and the electrode;
 wherein the active region has a total thickness less than or equal to about $0.25\lambda_n$ and wherein a portion of the active region is located between $0.1\lambda_n$ and $0.32\lambda_n$ from a surface of the electrode.

* * * * *

UNITED STATES PATENT AND TRADEMARK OFFICE
CERTIFICATE OF CORRECTION

PATENT NO.    : 6,900,474 B2
DATED         : May 31, 2005
INVENTOR(S)   : Mira S. Misra, Yu-Chen Shen and Stephen A. Stockman It is certified that error appears in the above-identified patent and that said Letters Patent is hereby corrected as shown below:

Column 11,
Line 58, cancel "is" and substitute -- the reflective surface is --.

Column 12,
Line 64, cancel "$0.32\lambda_n$" and substitute -- $0.3\lambda_n$ --.

Signed and Sealed this

Eleventh Day of October, 2005

JON W. DUDAS
*Director of the United States Patent and Trademark Office*